United States Patent
Stevenson

(10) Patent No.: US 6,856,357 B1
(45) Date of Patent: Feb. 15, 2005

(54) IMAGE SENSOR PACKAGING

(75) Inventor: David Hugh Stevenson, Dunfermline (GB)

(73) Assignee: STMicroelectronics Limited, Buckinghamshire (GB)

(*) Notice: Subject to any disclaimer, the term of this patent is extended or adjusted under 35 U.S.C. 154(b) by 714 days.

(21) Appl. No.: 09/591,886

(22) Filed: Jun. 9, 2000

(30) Foreign Application Priority Data

Jun. 11, 1999 (GB) .............................................. 9913516
Oct. 6, 1999 (GB) .............................................. 9923463

(51) Int. Cl.7 .............................................. H04N 5/225
(52) U.S. Cl. ...................................... 348/373; 348/272
(58) Field of Search ................................ 348/373, 374, 348/375, 272, 207.99; 257/434, 435, 632, 680

(56) References Cited

U.S. PATENT DOCUMENTS

| | | | |
|---|---|---|---|
| 4,871,921 A | 10/1989 | Gurnee | 250/578 |
| 5,218,234 A | 6/1993 | Thompson et al. | 257/787 |
| 5,433,911 A | 7/1995 | Ozimek et al. | 264/261 |
| 5,818,094 A | 10/1998 | Matsuo | 257/434 |
| 5,923,958 A | 7/1999 | Chou | 438/118 |
| 6,603,510 B1 * | 8/2003 | Wester | 348/272 |

* cited by examiner

Primary Examiner—Aung Moe
(74) Attorney, Agent, or Firm—Lisa K. Jorgenson; Allen, Dyer, Doppelt, Milbrath & Gilchrist, P.A.

(57) ABSTRACT

An image sensor device includes an image sensor chip and an image sensor array formed on a top surface of the image sensor chip. The image sensor chip is mounted on a substrate and encapsulated by a dam wall formed on the substrate surrounding the periphery of the image sensor chip and a transparent lid member affixed to the upper edges of the dam wall. A barrier is formed on the surface of the chip extending along at least a substantial part of at least one side of the sensor array between the sensor array and the dam wall. The barrier is preferably formed with a height of at least three microns and surrounds the sensor array. The barrier may be formed during fabrication of the sensor chip. Where the sensor chip is a color image sensor including a mosaic of color filter material overlying the image sensor array, the barrier may be formed from the color filter material with the formation of the mosaic. The barrier prevents resin bleeding from the dam wall onto the surface of the sensor array.

13 Claims, 2 Drawing Sheets

IMAGE SENSOR PACKAGING

FIELD OF THE INVENTION

The present invention relates to integrated circuits, and, more particularly, to the packaging of integrated circuits for use as image sensors ("image sensor chips").

BACKGROUND OF THE INVENTION

Most types of integrated circuits ("chips") require packaging to encapsulate the sensitive chips and provide mechanical protection during shipping, assembly and subsequent use. Optical chips, such as image sensors, are unique in that their packaging includes a transparent window to admit or release light. The window allows light to act upon the optical sensor array, which forms part of the chip. The transparent window, or lid, is commonly formed from glass. Optical devices of this type are difficult to manufacture because of stringent requirements for cleanliness. Any foreign material on the surface of the sensor array can cause image degradation which leads to rejection of the device and higher component cost due to reduced manufacturing yield.

Image sensor packages are typically formed by mounting a plurality of sensor chips in a rectangular array on a substrate tile (e.g., a ceramic tile). After wire bonding, a lattice of "dam" walls is formed using liquid epoxy between the adjacent chips so that each chip is surrounded on all four sides by a wall of epoxy. A glass sheet is then adhered to the tops of the dam walls and encapsulates each chip in isolation from the surrounding chips. The entire assembly is then baked to harden the epoxy walls and cut along the lines of the walls between adjacent sensors to produce a plurality of individual, encapsulated sensor devices.

This technique is very cost effective, but has a significant disadvantage. Resin can bleed out of the dam wall material when in the liquid state and run onto the chip surface. In some instances, the epoxy may bleed onto the critical image sensing array area causing unacceptable image blemishes. Accordingly, the manufacturing yield is reduced and the unit cost of the sensor device is increased. This problem applies to both monochrome and color sensors, the latter having a thin layer (typically less than 2 microns) of color filter material (the "mosaic") covering the sensitive array area.

SUMMARY OF THE INVENTION

It is an object of the present invention to provide an improved method for packaging image sensors that mitigates the above problem.

According to the present invention, a method of manufacturing an image sensor device is provided. The image sensor device includes an image sensor chip and an image sensor array formed on a top surface of the image sensor chip. The image sensor chip is mounted on a substrate and encapsulated by a dam wall formed on the substrate surrounding a periphery of the sensor chip. The image sensor also includes a transparent lid member affixed to the upper edges of the dam wall.

The method includes forming a barrier on the surface of the sensor chip extending along at least a substantial part of at least one side of the sensor array between the sensor array and the dam wall. The barrier is preferably formed with a height of at least three microns. The barrier may surround the sensor array and may be formed during fabrication of the sensor chip.

Where the sensor chip is a color image sensor including a mosaic of color filter material overlying the sensor array, the barrier may be formed from the color filter material during formation of the mosaic. Furthermore, the barrier may include a plurality of layers corresponding to a plurality of color filter materials used to form the mosaic.

An image sensor chip according to the present invention includes an image sensor array formed on a top surface of the image sensor chip. A barrier is formed on the top surface of the image sensor chip extending along at least a substantial part of at least one side of the image sensor array. The barrier preferably is formed with a height of at least three microns. The barrier may surround the image sensor array. Where the sensor chip is a color image sensor including a mosaic of color filter material overlying the sensor array, the barrier may be formed from the color filter material with the formation of the mosaic. Additionally, the barrier may include a plurality of layers corresponding to a plurality of color filter materials used to form the mosaic.

An image sensor device according to the present invention includes an image sensor chip and an image sensor array formed on a top surface of the image sensor chip. The image sensor chip is mounted on a substrate and encapsulated by a dam wall formed on the substrate surrounding the periphery of the sensor chip. The image, sensor device also includes a transparent lid member affixed to the upper edges of the dam wall and a barrier formed thereon extending along at least a substantial part of at least one side of the image sensor array between the image sensor array and the dam wall.

The barrier is preferably formed with a height of at least three microns, and the barrier may surround the sensor array. Where the image sensor chip is a color image sensor chip including a mosaic of color filter material overlying the sensor array, the barrier may be formed from the color filter material during formation of the mosaic. Furthermore, the barrier may include a plurality of layers corresponding to a plurality of color filter materials used to form the mosaic.

BRIEF DESCRIPTION OF THE DRAWINGS

Embodiments of the invention will now be described, by way of example only, with reference to the accompanying drawings, in which.

DETAILED DESCRIPTION OF THE PREFERRED EMBODIMENTS

Figure 1:
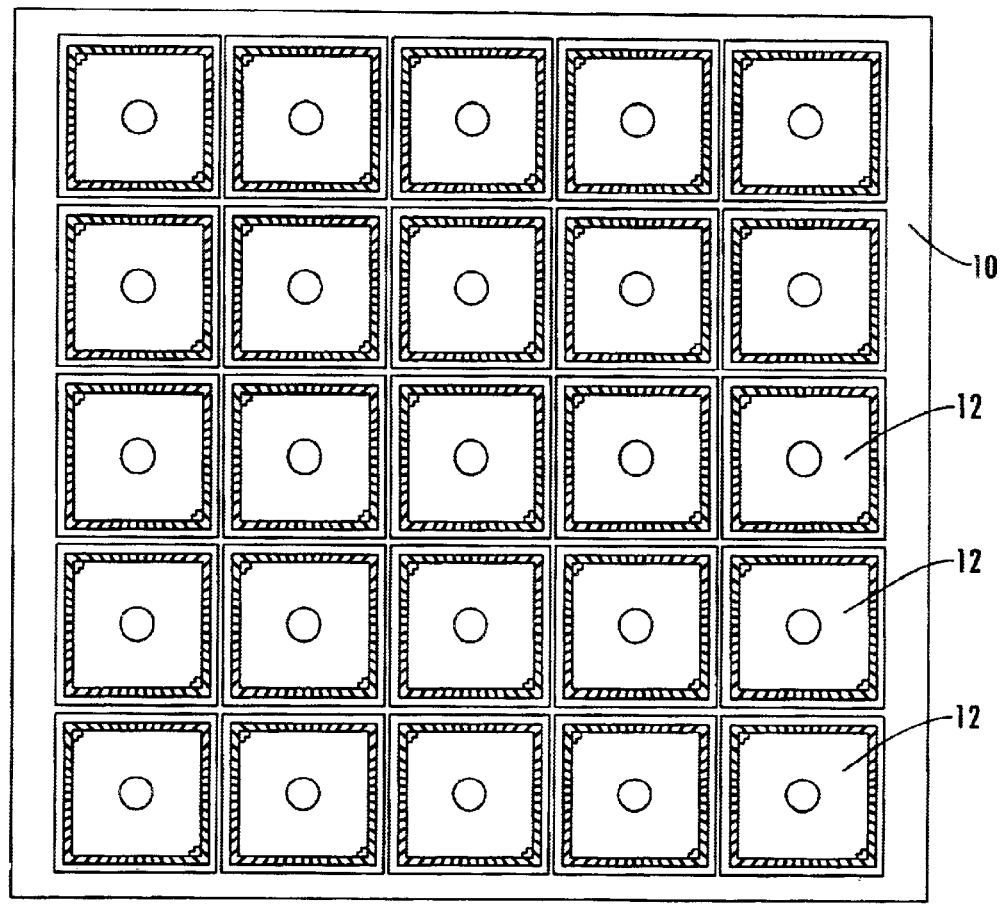
FIG. 1 is a plan view of a substrate having a plurality of image sensor chips mounted thereon according to the present invention.
Figure 2:
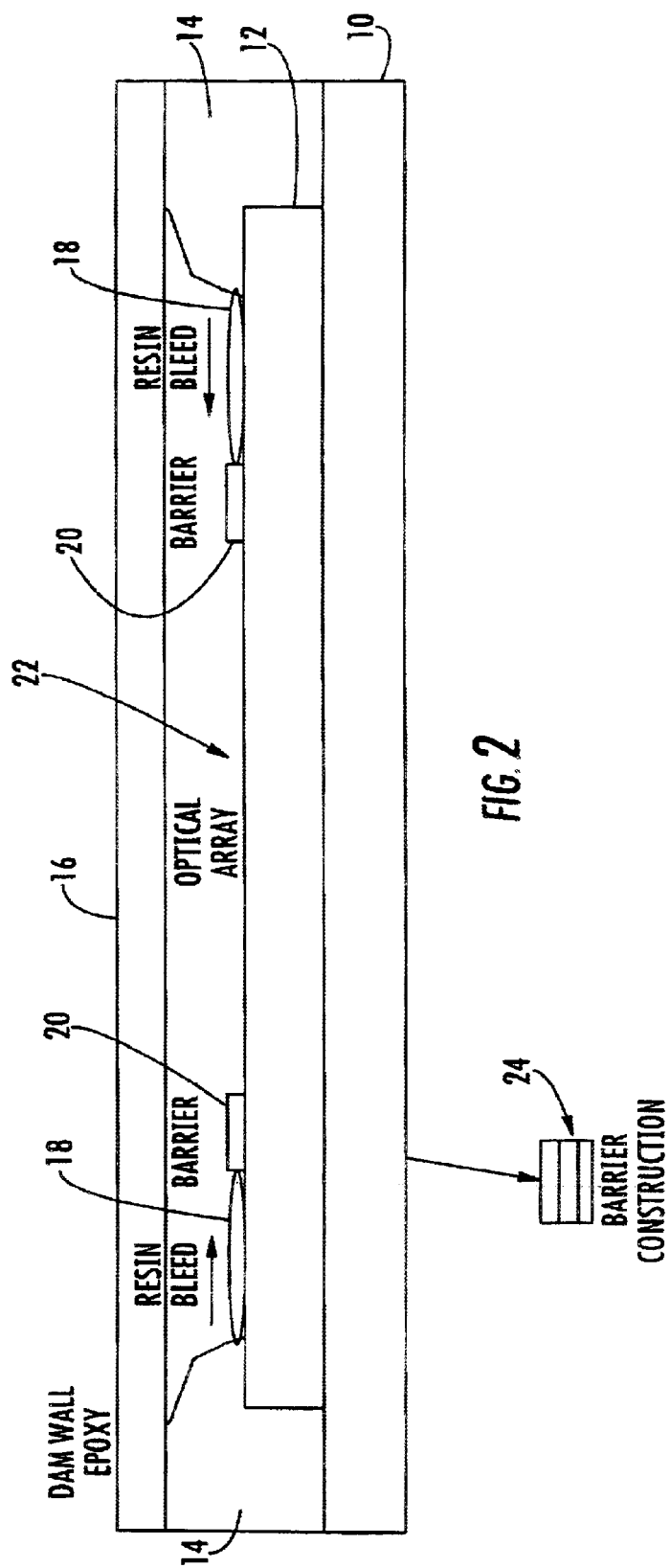
FIG. 2 is a cross-sectional view of an image sensor device formed in accordance with the present invention.

Referring now to FIGS. 1 and 2, a substrate 10, typically formed from a ceramic material, has an array of individual image sensor chips 12 mounted on an upper surface thereof. Each of the chips 12 includes an image sensor array 22 on its top surface. In a conventional manufacturing process, after wire bonding the individual chips 12 would be encapsulated on the substrate by forming dam walls 14 of a liquid epoxy material along the gaps between the chips 12 and around the periphery of the array of chips 12.

As seen in FIG. 2, the dam walls 14 are formed on a top surface of the substrate 10 and overlap the edges of the chips 12. A glass sheet 16 is then placed on top of the dam walls 14 and bonded to their upper edges so that each chip 12 is encapsulated between the substrate 10, the dam walls, and the glass sheet. The whole assembly is then baked to harden the dam walls 14 and "diced" by sawing along the dam walls 14 between the chips 12 and around the periphery of the array of chips 12 to produce a plurality of individual, packaged devices.

As noted above, a problem which arises with this conventional manufacturing technique is that a resin bleed 18 may occur out of the dam walls 14 while in the liquid state that runs over the chip 12 surface onto the image sensing area, causing unacceptable image blemishes. In accordance with the present invention, this problem is mitigated by forming a barrier 20 on the chip surface between the dam walls 14 and the image sensor array 22 of the chip 12. The barrier 20 impedes the resin bleed 18 from running onto the image sensor array 22.

It has been found that a barrier 20 of about 3 microns or more in height is effective in mitigating the resin bleed 18, although those of skill in the art will appreciate that shorter barriers may also be used. The barrier 20 may extend around the entire periphery of the sensor array 22. However, depending upon the size and location of the image sensor array 22 on the surface of chip 12 in relation to the dam walls 14, it may be sufficient to form the barrier 20 along at least a substantial part of at least one edge of the sensor array 22, as will be appreciated by those of skill in the art.

The barrier 20 may be formed during fabrication of the image sensor chip 12 as part of the manufacturing process. Formation of the barrier 20 may include depositing the barrier using any conventional chip fabrication process, such as photolithography, for example, as will be appreciated by those of skill in the art. The barrier 20 may be formed from materials which are conventionally used in the fabrication of the image sensor circuitry on a semiconductor wafer, which are also know to those of skill in the art. The use of such materials allows the invention to be implemented at relatively little cost.

In the case of a color image sensor, the barrier 20 may be built from the materials used to form a conventional three color filter mosaic on top of the image sensor array 22. Each color filter material layer is typically about one micron in thickness. Accordingly, stacking three layers of color filter material on top of one another in the barrier 20 area provides a barrier height of about three microns, without adding to existing manufacturing costs. This barrier construction is illustrated in detail 24 of FIG. 2.

The invention therefore provides improved image sensor chips, packaged image sensor devices, and methods of manufacturing the same. Those of skill in the art will appreciate that modifications and improvements thereto may be incorporated without departing from the scope of the invention.

That which is claimed is:

1. An image sensor chip comprising:
an image sensor array formed on a top surface of the image sensor chip;
a mosaic overlying said image sensor array comprising at least one color filter material; and
a barrier on the top surface of the image sensor chip extending along at least a substantial part of at least one side of said image sensor array, said barrier comprising the at least one color filter material.

2. The image sensor chip of claim 1 wherein said barrier is at least three microns high.

3. The image sensor chip of claim 1 wherein said barrier surrounds said image sensor array.

4. The image sensor chip of claim 1 wherein the at least one color filter material comprises a plurality of color filter materials; and wherein said barrier comprises a plurality of layers each comprising at least one of the plurality of color filter materials.

5. An image sensor device comprising:
a substrate;
an image sensor chip mounted on said substrate and having a top surface;
an image sensor array formed on the top surface of said image sensor chip;
a dam wall formed on said substrate surrounding a periphery of said image sensor chip and having an upper edge;
a transparent lid affixed to the upper edge of said dam wall and encapsulating said image sensor chip; and
a barrier on the top surface of said image sensor chip extending along at least a substantial part of at least one side of said image sensor array between said image sensor array and said dam wall.

6. The image sensor device of claim 5 wherein said barrier is at least three microns high.

7. The image sensor device of claim 5 wherein said barrier surrounds said image sensor array.

8. The image sensor device of claim 5 wherein said image sensor device further comprises a mosaic overlying said image sensor array comprising at least one color filter material; and wherein said barrier comprises the at least one color filter material.

9. The image sensor device of claim 8 wherein the at least one color filter material comprises a plurality of color filter materials; and wherein said barrier comprises a plurality of layers each comprising at least one of the plurality of color filter materials.

10. An image sensor device comprising:
a substrate;
an image sensor chip mounted on said substrate and having a top surface;
an optical element formed on the top surface of said image sensor chip;
a dam wall formed on said substrate surrounding a periphery of said image sensor chip and having an upper edge;
a transparent lid affixed to the upper edge of said dam wall and encapsulating said image sensor chip; and
a barrier on the top surface of said image sensor chip surrounding said optical element between said optical element and said dam wall.

11. The image sensor device of claim 10 wherein said barrier is at least three microns high.

12. The image sensor device of claim 10 wherein said image sensor device further comprises a mosaic overlying said optical element comprising at least one color filter material; and wherein said barrier comprises the at least one color filter material.

13. The image sensor device of claim 12 wherein the at least one color filter material comprises a plurality of color filter materials; and wherein said barrier comprises a plurality of layers each comprising at least one of the plurality of color filter materials.

* * * * *